US010261161B2

(12) United States Patent
Wang et al.

(10) Patent No.: US 10,261,161 B2
(45) Date of Patent: Apr. 16, 2019

(54) PHANTOM FOR QUANTITATIVE DIFFUSION MAGNETIC RESONANCE IMAGING

(71) Applicant: Wisconsin Alumni Research Foundation, Madison, WI (US)

(72) Inventors: Xiaoke Wang, Madison, WI (US); Scott Brian Reeder, Middleton, WI (US); Diego Hernando, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 685 days.

(21) Appl. No.: 14/739,554

(22) Filed: Jun. 15, 2015

(65) Prior Publication Data

US 2016/0363644 A1 Dec. 15, 2016

(51) Int. Cl.
*G01R 33/58* (2006.01)
*G01R 33/563* (2006.01)

(52) U.S. Cl.
CPC ........ *G01R 33/58* (2013.01); *G01R 33/56341* (2013.01)

(58) Field of Classification Search
None
See application file for complete search history.

(56) References Cited

U.S. PATENT DOCUMENTS

| 7,408,354 | B2* | 8/2008 | Woo | G01R 33/58 |
| | | | | 324/307 |
| 9,603,546 | B2* | 3/2017 | Horkay | A61B 5/055 |
| 2012/0068699 | A1* | 3/2012 | Horkay | A61B 5/055 |
| | | | | 324/300 |
| 2016/0363645 | A1* | 12/2016 | Reeder | G01R 33/58 |
| 2017/0242090 | A1* | 8/2017 | Horkay | G01R 33/58 |

FOREIGN PATENT DOCUMENTS

| EP | 1840588 A2 * | 10/2007 | ........... G01R 33/485 |
| EP | 1840588 | 5/2012 | |

OTHER PUBLICATIONS

Toryanik et al, "Molecular Mobility and Structure in Water-Acetone Mixtures", Sep.-Oct. 1987, Donets Univeristy, vol. 28, No. 5, pp. 714-718.*
Hara et al., A new phantom and empirical formula for apparent diffusion coefficient measurement by a 3 tesla magnetic resonance imaging scanner, Oncology Letters, 2014, p. 819-824, vol. 8, United States.

(Continued)

*Primary Examiner* — Jermele M Hollington
(74) *Attorney, Agent, or Firm* — Quarles & Brady LLP

(57) ABSTRACT

A phantom for use with magnetic resonance imaging ("MRI") and, in particular, for calibrating quantitative diffusion MRI is provided. In general, the phantom includes a solution composed of a solvent that has diffusivity value higher than that of water, and a solute that when added to the solvent reduces the diffusivity of the solution. By varying the combined concentration of the solvent and solute, the diffusivity of the solution can be controlled to fall within a range of diffusivity values found in biological tissues in a variety of different physiological conditions or tissue environments.

20 Claims, 2 Drawing Sheets

(56) References Cited

OTHER PUBLICATIONS

Lavdas et al., A phantom for diffusion-weighted MRI (DW-MRI), JMRI, 2013, p. 173-179, vol. 38, Wiley Periodicals, United States.

Pierpaoli et al., Polyvinylpyrrolidone (PVP) water solutions as isotropic phantoms for diffusion MRI studies, Proc. Intl. Soc. Mag. Reson. Med., 2009, p. 1414, vol. 17, ISMRM, United States.

Guo et al., Sifferentiation of Clinically Benign and Malignant breast lesions using diffusion-weighted imaging, JMRI, 2002, p. 172-178, vol. 16, Wiley-Liss, United States.

Taviani et al., Single breath-hold 3D radial imaging for R2 and fat fraction quantification in the liver, Proc. Intl. Soc. Mag. Reson., 2013, p. 597, ISMRM, United States.

Toryanik A.I., Taranenko V.N., Molecular mobility and structure in water-acetone mixtures, Shevchenko Kiev University, 1986, vol. 28, Plenum Plublishing Corp.

\* cited by examiner

PHANTOM FOR QUANTITATIVE DIFFUSION MAGNETIC RESONANCE IMAGING

STATEMENT REGARDING FEDERALLY SPONSORED RESEARCH

This invention was made with government support under DK083380, DK088925, DK 100651, and DK 102595 awarded by the National Institutes of Health. The government has certain rights in the invention.

BACKGROUND OF THE INVENTION

The field of the invention is systems and methods for magnetic resonance imaging ("MRI"). More particularly, the invention relates to a phantom for quantitative diffusion MRI.

Among numerous magnetic resonance imaging contrast mechanisms, the insight that diffusion-weighted MRI provides into the microstructural changes in tissues makes it an excellent biomarker for the detection and evaluation of necrosis, infection, fibrosis, and cancer. To realize the diagnostic potential of diffusion-weighted MRI, it is important to develop quantitative diffusion MRI ("q-DMRI") techniques that produce reproducible, accurate, and robust measurements of the apparent diffusion coefficient ("ADC") or diffusivity. Such q-DMRI techniques would have tremendous potential for various imaging applications, including tumor characterization and treatment monitoring. However, for q-DMRI to become a valid biomarker, validation of its accuracy and reproducibility is needed.

Phantoms are devices that are placed in the bore of an MRI system to test or calibrate its operation. Phantoms may be made of materials having known magnetic resonance properties or they may contain cavities filled with such materials. The MRI system is operated with the phantom in place to produce a spectrum or an image from which proper operation of the MRI system may be determined. Phantoms exhibiting desired diffusion behavior could provide a controlled setting for the development and validation of q-DMRI techniques.

Ideally, phantoms used for diffusion quantification should possess a single-peak magnetic resonance spectrum; a single exponential diffusion decay profile; and apparent diffusion coefficient ("ADC"), or diffusivity, values over the entire physiological range (e.g., $0.62 \times 10^{-3}$ mm$^2$/s to $2.60 \times 10^{-3}$ mm$^2$/s). Furthermore, it would be preferable for the phantoms to have these characteristics under a well controlled temperature.

Early phantoms used in diffusion-MRI were made of different pure substances, such as water or ethanol. These phantoms are easy to construct and easy to use, and they also have well-characterized simple diffusion behavior. Compounds such as ethanol, however, also have a magnetic resonance spectrum with multiple peaks. Multiple spectral peaks can lead to image artifacts, such as chemical shift related artifacts. In addition, by using pure substances, only a limited number of discrete ADC values can be achieved at any controlled temperature.

Recently proposed phantoms for q-DMRI have used water as a solvent, to which solutes are added to change the diffusivity of the resulting solution. As one example, these phantoms have included water solution phantoms in which sucrose or a polymer, such as sucrose polyvinyl pyrrolidone ("PVP"), are added as solutes to water. These water solution phantoms, however, do not meet all of the desirable properties for a q-DMRI phantom listed above.

There remains a need to provide phantoms for q-DMRI that have desirable magnetic resonance spectra, have desirable diffusion decay profiles, and have diffusivity values that span the entire range of diffusivities of biological tissues under a variety of physiological conditions and tissue environments.

SUMMARY OF THE INVENTION

The present invention overcomes the aforementioned drawbacks by providing a calibration phantom for quantitative diffusion magnetic resonance imaging ("MRI"). The phantom includes a housing that contains a solution comprising a solvent and a solute. The solvent has a base diffusivity higher than the diffusivity of water, and the solute reduces the diffusivity of the solution through chemical interactions with the solvent.

The foregoing and other aspects and advantages of the invention will appear from the following description. In the description, reference is made to the accompanying drawings that form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Described here is a phantom for use with magnetic resonance imaging ("MRI") and, in particular, for calibrating quantitative diffusion MRI. In general, the phantom includes a solution composed of a solvent that has diffusivity value higher than that of water, and a solute that when added to the solvent reduces the diffusivity of the solvent. By varying the combined concentration of the solvent and solute, the diffusivity of the solution can be controlled to fall within a range of diffusivity values found in biological tissues in a variety of different physiological and pathophysiological conditions or tissue environments.

As will be described in detail below, the solvent and solute are preferably selected to have desirable nuclear magnetic resonance ("NMR") spectra. For example, the solvent can be selected to have an NMR spectrum with a single peak (or a single visible peak using conventional imaging parameters), and the solute can be selected to have an NMR spectrum that produces little to no measureable signal over the range of resonance frequencies for which a measurable NMR signal can be produced from the solvent.

The development and quality assurance of quantitative diffusion MRI techniques can be achieved by using the phantoms described here to enable controlled testing. The phantoms described here exhibit several important desirable properties, including single peak NMR spectra and Gaussian diffusion propagation. Under temperature-controlled conditions (e.g., submerging the phantom in an ice-water bath), the phantom can reproducibly exhibit ADC values that cover the entire physiological range.

Figure 1:
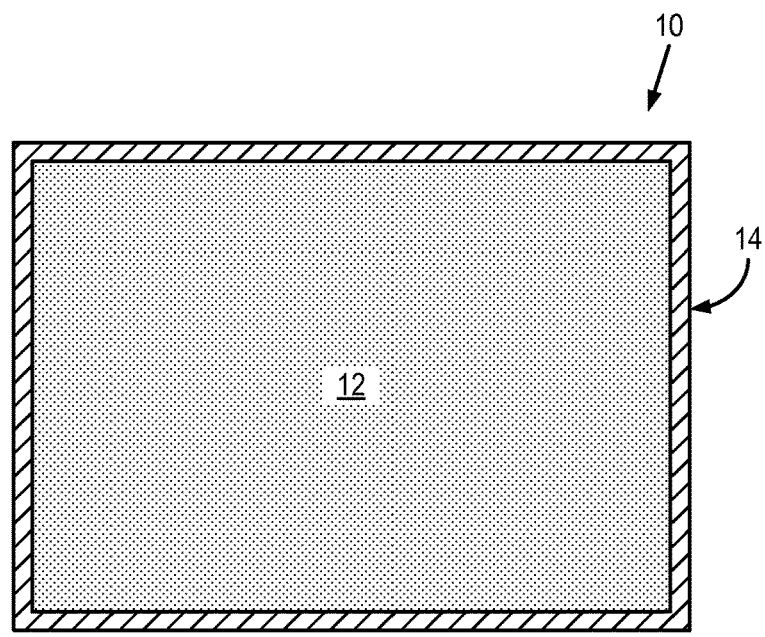
FIG. 1 is an example of a calibration phantom useful for calibrating quantitative diffusion magnetic resonance imaging ("q-DMRI") techniques.

Referring now to FIG. 1, an example of a phantom 10 for calibrating quantitative diffusion MRI is illustrated. The phantom 10 includes a solution 12 that is composed of a solvent and at least one solute. As will be described below, the solution 12 is preferably formulated based on the principle that increasing concentrations of solute in the solvent will decrease the diffusivity of the solvent to within the desired physiological range of diffusivities. Furthermore, different types of paramagnetic salt may be added into the mixture to control $T_1$ and $T_2$ relaxation of the phantom 10. Examples of paramagnetic salts that can be added to the solution 12 include zinc chloride, iron chloride, scandium basic thiocyanate, chromium chloride, cobalt chloride, copper sulphate, manganese chloride, nickel chloride, and sodium chloride. For instance, when the solvent is selected as acetone, the paramagnetic salt can be zinc chloride or iron chloride, which are both soluble in acetone.

The solution 12 is contained in a housing 14 that is constructed of an MR-compatible material. As a few non-limiting examples, the housing 14 can be constructed of plastics, such as polycarbonate, polyethylene, polystyrene, polyvinyl chloride, and so on.

The housing 14 can have any suitable shape, including rectangular, cylindrical, spherical, or being shaped to mimic a particular anatomy. As one example, the housing 14 can be cylindrical or spherical to reduce susceptibility effects at the interface of the solution 12 and the wall of the housing 14.

In some configurations, the housing 14 can include an opening through which the housing 14 can be filled with the solution 12. In other configurations, the housing 14 is sealed after being filled with the solution 12.

Figure 2:
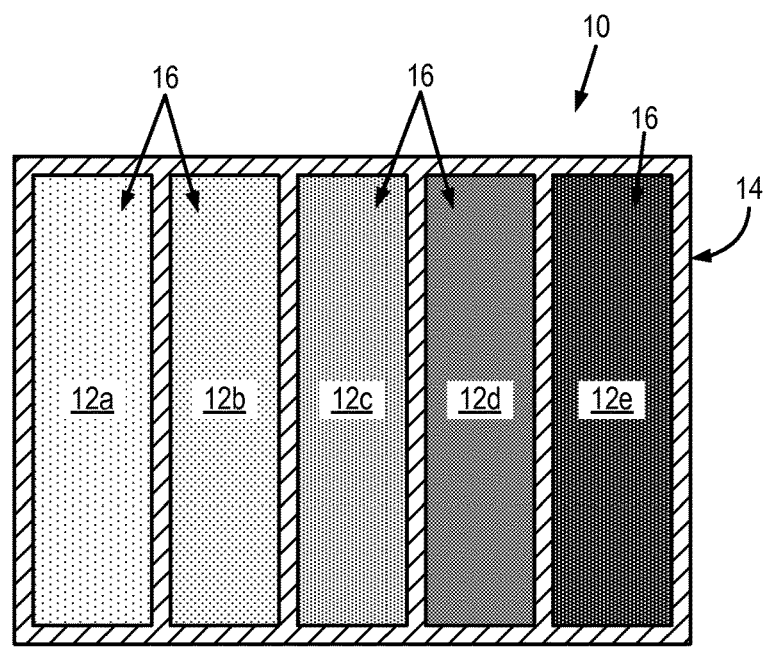
FIG. 2 is another example of a calibration phantom useful for calibrating q-DMRI techniques, wherein the phantom includes multiple compartments each containing a different solution or a different concentration of the same solution.

As shown in FIG. 2, the housing 14 can also include multiple different compartments 16 that can be filled with different solutions (e.g., solutions 12a-12e). For instance, each compartment 16 can be filled with a solution composed of the same solvent and solute, but in different ratios. In this manner, each compartment 16 will correspond to a different diffusivity value in the desired range of physiologically and pathophysiologically relevant diffusivities. As another example, each compartment 16 can be filled with a different solution 12 such that each compartment 16 represents a different diffusivity value.

Figure 3:
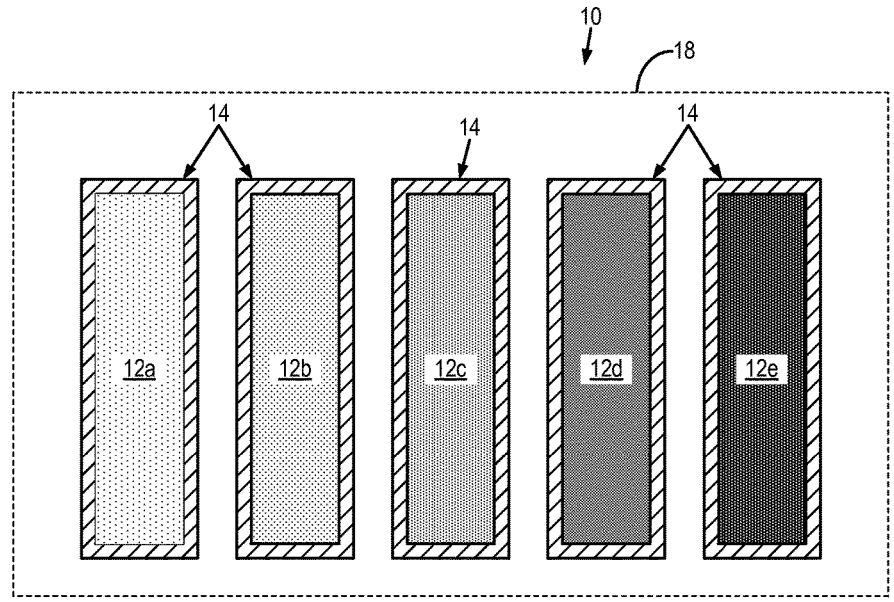
FIG. 3 is another example of a calibration phantom useful for calibrating q-DMRI techniques, wherein the phantom includes multiple different containers each containing a different solution or a different concentration of the same solution.

As shown in FIG. 3, the phantom 10 can also include multiple different housings 14 each containing a different solution 12, or a solution 12 with a different ratio of solvent and solute (e.g., solutions 12a-12e). These multiple housings 14 can be contained in a larger container 18. In some embodiments, the container 18 can include an ice water bath for controlling the temperature of the solutions 12. This configuration has the benefit that the different housings 14 can be selectively removed from the phantom 10 to provide different diffusivities that can be measured with the phantom.

In some embodiments, the housing 14, or compartments 16 formed therein, can be constructed to restrict diffusion of the solution 12 along one or more directions in order to achieve anisotropic diffusion characteristics in the phantom 10. These anisotropic diffusion characteristics can be measured to calibrate diffusion tensor imaging ("DTI") and other diffusion MRI-based techniques that measure anisotropic diffusion properties. As one example, the housing 14 or compartments 16 can have formed therein a bundle of capillaries that restrict diffusion of the solution 12 along one or more directions. For instance, the capillaries can include small tubes composed of non-magnetic materials. Preferably, the capillaries are composed of a material that does not produce magnetic resonance signals in the range of magnetic resonance spectral peaks associated with the solution 12. These capillaries can be formed throughout the entire volume of the housing 14 or compartments 16, or can be formed in one or more subvolumes of the housing 14 or compartments 16. As another example, the housing 14 or compartments 16 can be filled, partially or fully, with non-magnetic rods so as to restrict diffusion of the solution 12 along one or more directions. Preferably, these non-magnetic rods are composed of a material that does not produce magnetic resonance signals in the range of magnetic resonance spectral peaks associated with the solution 12.

The solution 12 is generally formulated such that the diffusivity of the solution 12 can be adjusted to any value within the range of common physiological diffusivities by varying the combined concentration of solute and solvent in the solution 12. The diffusivity of the solution 12 can also be varied by controlling the temperature of the solution 12. In some embodiments, the solution 12 is formulated to have diffusivity values that fall within the range of common physiological diffusivities. As one example, the solution 12 can be formulated to have diffusivities that fall in the range of $0.2 \times 10^{-3}$ mm$^2$/s to $3.0 \times 10^{-3}$ mm$^2$/s.

Preferably, the solution 12 is formulated to achieve the desired range of physiologically relevant diffusivities at a particular reproducible and reliably controllable temperature. For instance, the solution 12 can be formulated to have diffusivity values that fall within the range of common physiological diffusivities when the solution 12 is maintained at 0° C., which is easy to reproduce using icer-water baths. As one example, the solution 12 can be formulated to have diffusivities that fall in the range of $0.62 \times 10^{-3}$ mm$^2$/s to $2.62 \times 10^{-3}$ mm$^2$/s.

In general, the solvent is selected to have the following properties. The solvent preferably has a nuclear magnetic resonance spectrum that is amenable to imaging with MRI. For instance, the solvent preferably has an NMR spectrum that contains a single-peak, or otherwise contains one significantly dominant peak that can be readily imaged without interference from signals related to other resonance peaks.

The solvent preferably also has a diffusivity that is higher than water. As will be described below, the solute is then selected in part on its ability to decrease the diffusivity of the solution when mixed with the solvent. In this manner, the concentration of the solute in the solution can be used to lower the diffusivity of the solution into a desired range, such as the range of physiological diffusivities of water in various tissues, tissue environments, and physiological conditions. Because the solvent is chosen to have a diffusivity higher than water, by controlling the combined concentration of the solvent and solute, the diffusivity of the solution can be varied to be within a physiologically relevant range.

As one non-limiting example, the solvent can be acetone. Compared with water, acetone has higher ADC at 0° C. (i.e., ADC=$3.15 \times 10^{-3}$ mm$^2$/s). Therefore, by mixing acetone with an appropriate solute, the ADC of acetone in solution can be lowered to achieve a broad range of ADC values spanning the entire physiological range. As another example, the solvent can be diacetyl.

In general, the solute is selected to produce essentially no measurable magnetic resonance signal over the range of resonance frequencies for which the solvent will produce a measurable signal. That is, the solute should not confound the measurement of diffusivities from the solvent when in solution. As one non-limiting example, the solute can be deuterium oxide, which is also referred to as heavy water.

Thus, as one non-limiting example for the solution 12 in the calibration phantom 10, the solvent can be acetone and the solute can be deuterium oxide. Increasing the concentration of deuterium oxide in the solution decreases the diffusivity of acetone because of hydrogen-bond strengthening. Thus, other combinations of solvent and solute that exhibit this chemical interaction can also be used when formulating the solution used in the phantom.

Pure acetone has a higher diffusivity value than water, and increasing the concentration of water mixed in the acetone enables a wide range of ADC values through hydrogen-bond strengthening or other hydrogen bond effects. Preferably, this wide range of ADC values should be achievable at a temperature that can be consistently reproduced and maintained, such as 0° C., which can be achieved by placing the phantom 10 in an ice water bath as described above with respect to FIG. 3. When submerged in ice-water bath, the chemical shift of acetone may cause acetone signal to be super-imposed on water signal in images acquired using diffusion-weighted echo planar imaging (DW-EPI). As such, in some embodiments, the ice-water bath can be doped with a relaxivity agent, such as chelated gadolinium or manganese chloride, to overcome this problem by effectively eliminating the water signal. Similarly, regular water mixed with a relaxivity agent could be used to eliminate the water signal as an alternative to using heavy water.

Figure 4:
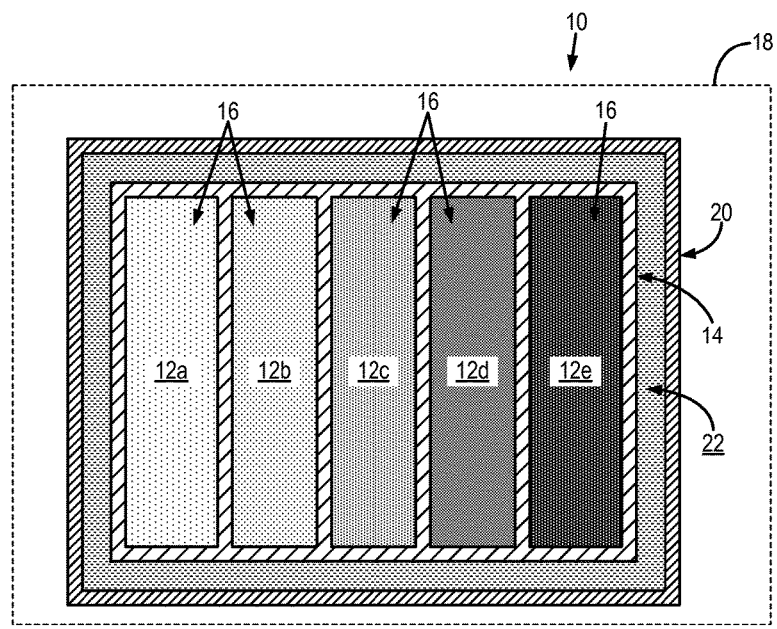
FIG. 4 is another example of a calibration phantom useful for calibrating q-DMRI techniques, wherein the phantom includes multiple compartments contained in a fluid-tight container that contains a fluid doped with a relativity agent, and wherein each compartment contains a different solution or a different concentration of the same solution.

As illustrated in FIG. 4, in some embodiments the phantom 10 can include a housing 14 that is positioned in a fluid-tight container 20 that contains a fluid 22 doped with a relaxivity agent. For example, the fluid 22 can be water. The phantom 10 can then be submerged in an ice-water bath environment that has not been doped with a relaxivity agent. This configuration allows the temperature of the ice-water bath to remain unaffected by the addition of a relaxivity agent, while providing an additional layer of separation between the housing 14 containing the one or more solutions 12 and the ice-water bath.

The magnetic resonance spectrum of this example phantom is reduced to a single peak (i.e., the acetone peak) by using deuterium oxide as the solute. With reference again to FIGS. 2-4, where the phantom 10 includes a housing 14 with multiple compartment 16, or includes multiple separate housings 14, solutions 12 with different combined concentrations of solvent and solute can be prepared and used in the phantom 10. For example, in an acetone-deuterium oxide solution, deuterium oxide concentrations of 0% (v/v), 5% (v/v), 10% (v/v), 20% (v/v), 40% (v/v) can be used.

The phantoms described here provide a calibration phantom having a single spectral peak with a wide range of ADC values covering the entire physiological range. Therefore, the phantoms described here can be advantageously used for the development and validation of q-DMRI techniques.

Having generally described various calibrations phantoms for use in q-DMRI techniques, an example method for using the calibration phantom is now briefly described. The calibration phantom 10 can be used to calibrate an MRI system for use in q-DMRI techniques. The phantom 10 can be positioned in the bore of the MRI system and images of the one or more solutions 12 in the phantom 10 can be obtained. Because the one or more solutions 12 have known diffusivities, the diffusivities (e.g., ADC values) computed from these images can be compared to the known diffusivities to calibrate the MRI system.

The calibration phantom 10 can also be used as a part of a quality assurance process, a quality control process, or both. This type of calibration can be performed at the facility where the MRI system is manufactured, or after installation of the MRI system at the clinical site as part of acceptance testing. For instance, the calibration can be performed as part of repairing or otherwise maintaining the MRI system, including periodic accreditation or other scanner quality control qualification procedures. The calibration phantom can also be used for routine quality assurance, where the MRI system can be periodically calibrated to ensure consistent diffusion image quality.

The present invention has been described in terms of one or more preferred embodiments, and it should be appreciated that many equivalents, alternatives, variations, and modifications, aside from those expressly stated, are possible and within the scope of the invention.

The invention claimed is:

1. A calibration phantom for quantitative diffusion magnetic resonance imaging (MRI), comprising:
   a housing;
   a solution contained in the housing, the solution comprising a solvent, a solute, and a relaxivity agent, wherein:
   the solvent has a base diffusivity higher than the diffusivity of water, and wherein the solvent is selected to have a single peak in a nuclear magnetic resonance spectrum when the solution is imaged with an MRI system;
   the solute reduces the diffusivity of the solution through chemical interactions with the solvent;
   the relaxivity agent is added to the solution in an amount to reduce the solute signal in the nuclear magnetic resonance spectrum, and wherein the solution comprises a single visible peak relative to other resonance peaks in the nuclear magnetic resonance spectrum when imaged with an MRI system.

2. The calibration phantom as recited in claim 1, wherein the relaxivity agent is added to the solution in an amount to effectively eliminate the solute signal from the nuclear magnetic resonance spectrum.

3. The calibration phantom as recited in claim 1, wherein the solute is water.

4. The calibration phantom as recited in claim 3, wherein the solvent is acetone.

5. The calibration phantom as recited in claim 3, wherein the solvent is diacetyl.

6. The calibration phantom as recited in claim 1, wherein the housing has formed therein a plurality of compartments, and wherein each compartment contains a different concentration of the solution such that each compartment corresponds to a different diffusivity.

7. The calibration phantom as recited in claim 1, wherein the housing has formed therein a plurality of compartments, and wherein a different solution is contained in each compartment such that each compartment corresponds to a different diffusivity.

8. The calibration phantom as recited in claim 1, further comprising a plurality of housings, each of the plurality of housings having contained therein a different concentration of the solution.

9. The calibration phantom as recited in claim 1, further comprising a container having a volume configured to receive the housing and to receive a fluid such that the fluid adjusts a temperature of the solution contained in the housing.

10. The calibration phantom as recited in claim 9, wherein the fluid is water.

11. The calibration phantom as recited in claim 10, wherein the water is ice water.

12. The calibration phantom as recited in claim 10, wherein the water is doped with a relaxivity agent.

13. The calibration phantom as recited in claim 12, wherein the relaxivity agent includes at least one of chelated gadolinium or manganese chloride.

14. The calibration phantom as recited in claim 1, further comprising a container having a volume configured to receive the housing and to receive a fluid that is doped with a relaxivity agent.

15. The calibration phantom as recited in claim 14, wherein the fluid is water and the relaxivity agent includes at least one of chelated gadolinium or manganese chloride.

16. The calibration phantom as recited in claim 15, wherein the container is sized to be positioned in an ice-water bath to control a temperature of the solution contained in the housing.

17. The calibration phantom as recited in claim 1, wherein the solution further comprises a paramagnetic salt to adjust at least one of a longitudinal relaxation or a transverse relaxation of the solution.

18. The calibration phantom as recited in claim 17, wherein the paramagnetic salt is at least one of zinc chloride or iron chloride.

19. The calibration phantom as recited in claim 1, wherein the solute reduces the diffusivity of the solution through hydrogen-bond strengthening with the solvent.

20. The calibration phantom as recited in claim 1, wherein the solution comprises an apparent diffusion coefficient (ADC) in the range of physiological diffusivities of water in biological tissues.

* * * * *